United States Patent [19]

Fredericks et al.

[11] Patent Number: 4,640,738

[45] Date of Patent: Feb. 3, 1987

[54] SEMICONDUCTOR CONTACT PROTECTION

[75] Inventors: Edward C. Fredericks, Haymarket; Madan M. Nanda, Reston, both of Va.

[73] Assignee: International Business Machines Corporation, Armonk, N.Y.

[21] Appl. No.: 623,656

[22] Filed: Jun. 22, 1984

[51] Int. Cl.[4] ............... H01L 21/312; B44C 1/22
[52] U.S. Cl. .................................. 156/656; 156/657; 156/659.1; 156/662; 430/314; 430/317; 427/90; 357/67
[58] Field of Search ............ 156/643, 655, 656, 657, 156/659.1, 661.1; 427/88, 93, 89, 90, 91; 29/578, 591; 357/71, 67; 430/314, 317, 313, 323, 324

[56] References Cited

U.S. PATENT DOCUMENTS

| | | | |
|---|---|---|---|
| 3,985,597 | 10/1976 | Zielinski | 156/655 X |
| 4,076,575 | 2/1978 | Chang | 156/659.1 X |
| 4,361,599 | 11/1982 | Wourms | 427/90 |
| 4,367,119 | 1/1983 | Logan et al. | 156/653 X |
| 4,377,633 | 3/1983 | Abrahamovich et al. | 156/661.1 X |
| 4,410,622 | 10/1983 | Dalal et al. | 156/661.1 X |
| 4,514,751 | 4/1985 | Bhattacharya | 357/71 |

FOREIGN PATENT DOCUMENTS 53-14570  2/1978  Japan .................. 430/314

OTHER PUBLICATIONS

Hitchner, J. E., et al. "Chromium As An RIE Etch Barrier", IBM Technical Disclosure Bulletin, vol. 22, No. 10, Mar. 1980, pp. 4516-4517.

Primary Examiner—Donald Czaja
Assistant Examiner—Ramon R. Hoch
Attorney, Agent, or Firm—Jesse L. Abzug

[57] ABSTRACT

In a photoresist lift-off process for depositing metal on a semiconductor substrate, a protective coating of silicon is applied to an etched via hole prior to the metal deposition step. This prevents the formation of contaminant trapping voids and contaminated chemical residues which would otherwise occur at the base of the metal line subsequently deposited in the bottom of the via hole. The protective silicon layer, which has a thickness of from 100 to 300 angstroms, remains intact as a permanent part of the structure.

7 Claims, 9 Drawing Figures

SEMICONDUCTOR CONTACT PROTECTION

FIELD OF THE INVENTION

The invention disclosed broadly relates to semiconductor processing and more particularly relates to metal deposition techniques in semiconductor processing.

BACKGROUND OF THE INVENTION

Alkaline developers and chemical etchants, used to develop the photoresist layer for first and second metal layer depositions in existing FET processes, severely attack the contact metal, thereby producing poor interlevel contacts and possibly electrical failures. Also, contaminant residues, or voids created by the reaction of the etchants with existing contact metals or semiconductor substrates, will impact reliability and life of the device structures. These residues and voids increase resistance which is a significant cause of device failure.

It is known to protect ion implanted and diffused contacts by depositing a barrier metal over the implanted area so that it will not be depleted by subsequent etching and/or other processes. This provides protection for the ion implanted diffused and/or buried contacts. However, it does not protect against chemical attack on the sides of the metal contact in via holes.

A common problem with metal deposition of contact or other metal to provide interconnections in the semiconductor device is that the state-of-the-art deposition tooling deposits metal at an angle to the device wafer surface, primarily because the molten metal source is not at a "line of sight" perpendicular to the wafer surface. Therefore voids or spacing will inherently exist between the contact metal and the sides of the etched insulator.

OBJECTS OF THE INVENTION

It is therefore an object of the invention to provide an improved metallization process for semiconductor devices.

It is another object of the invention to provide an improved metallization process which diminishes the problem of alkaline developers attacking contact metal structures.

It is still another object of the invention to diminish void formations and eliminate chemical residues in the metal contact area in order to maintain contact integrity.

SUMMARY OF THE INVENTION

These and other objects, features and advantages of the invention are accomplished by the process disclosed herein. In a photoresist lift-off process for depositing metal on a semiconductor substrate, a protective layer is applied to the etched via hole prior to the metal deposition step. This prevents the formation of contaminant trapping voids and chemical residues which would otherwise occur at the base and/or sides of the metal subsequently deposited in the contact via hole. The protective layer, which has a thickness of from 100 to 300 angstroms, remains intact as a permanent part of the structure.

DESCRIPTION OF THE FIGURES

These and other objects, features and advantages of the invention will be more fully appreciated with reference to the accompanying figures.

DISCUSSION OF THE PREFERRED EMBODIMENT

In the preferred embodiment of our invention, a photoresist lift-off process is described for depositing metal on a semiconductor substrate or ion implanted contacts. Then, a protective film is formed over etched via holes prior to the metal deposition step. This prevents the formation of contaminant trapping voids and chemical residues which would otherwise occur at the base and/or sides of the metal subsequently deposited in the etched contact via hole. The protective film, which has a thickness of from 100 to 300 angstroms, remains intact as a permanent part of the structure.

Figure 1:
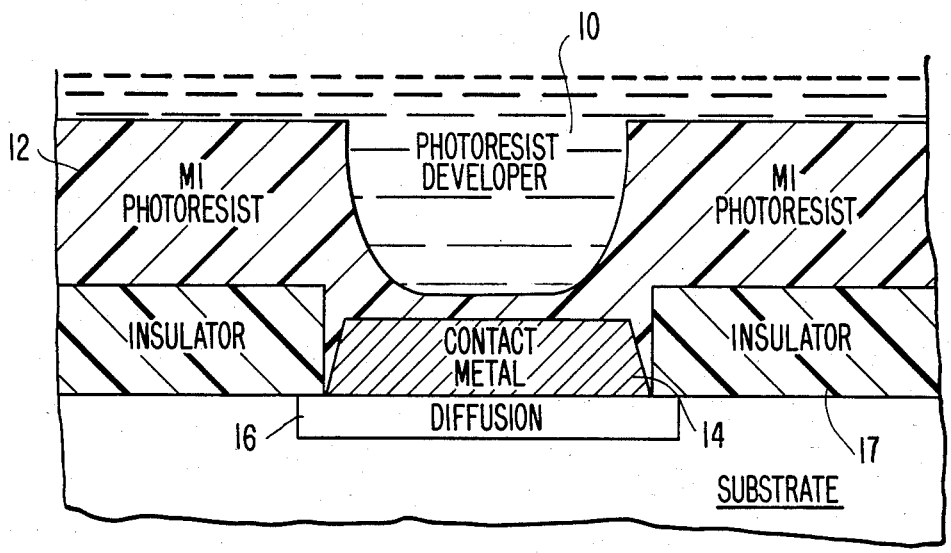
FIGS. 1, 2 and 3 are a sequence of steps in existing photolithographic development processes, to produce a typical photoresist structure prior to metallization over contact metallurgy.
Figure 2:
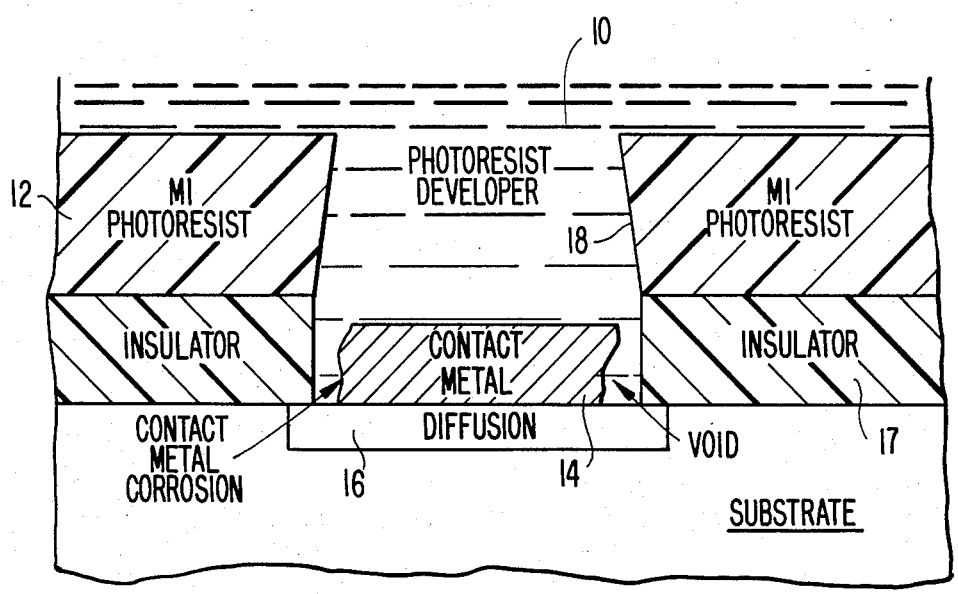
Figure 3:
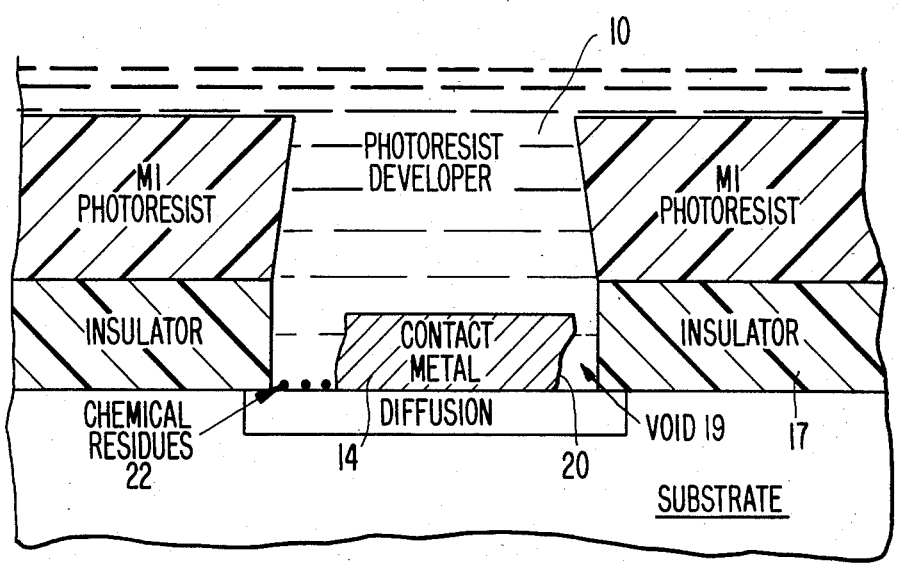

In prior art methods, alkaline developers attack the contact metal. This is shown in FIGS. 1 through 3 which illustrates the prior art problem. In FIG. 1, the developer 10 has progressed almost all the way through photoresist layer 12, providing a structure for later to be deposition of interconnect metal but short of contacting the previously deposited contact metal 14 over the substrate or ion implanted diffused area 16. In FIG. 2, the developer 10 is shown to have completely removed the photoresist 12 for subsequently depositing interconnect metal over the contact 14. The developer 10 is now in contact with contact metal 14 at the bottom as well as the sides of via hole 18.

In FIG. 3, it is seen that the developer 10 is actually attacking the physical structure of the previously deposited contact metal 14 and corroding it thereby leaving a void 19. The corroded contact metal is shown to have a reduced cross-sectional area 20 which increases the resistance per unit length of the metal contact. This also presents the problem of entrapping some of the alkaline developer and/or other chemical reaction residues 22 which may present contamination problems, thereby impacting the reliability and life of the product.

Figure 4:
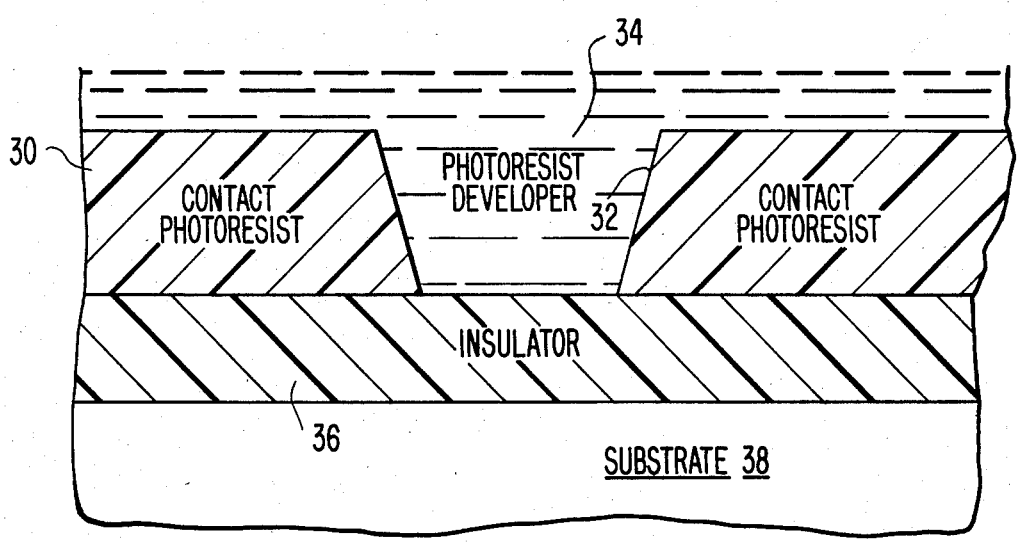
FIG. 4 illustrates the first step of the invention relating to developing the resist of the contacts.
Figure 5:
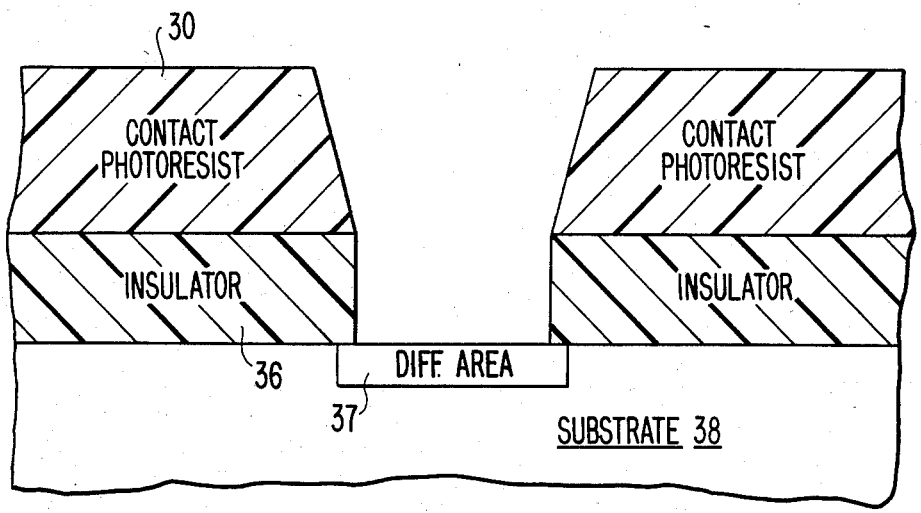
FIG. 5 illustrates the steps of etching the insulator to produce contacts in the substrate and/or over the ion implanted diffused areas.

The invention is shown in the sequence of steps illustrated in FIGS. 4 through 9. In FIG. 4, a contact photoresist layer 30 is shown with a via hole 32 made by a photoresist developer 34 over an insulator 36. The appropriate portion of the insulator is then wet or dry chemical etched to the semiconductor substrate 38 as shown in FIG. 5. An ion implant to produce a diffused area 37 in the semiconductor substrate can be done at this time if desired.

Figure 6:
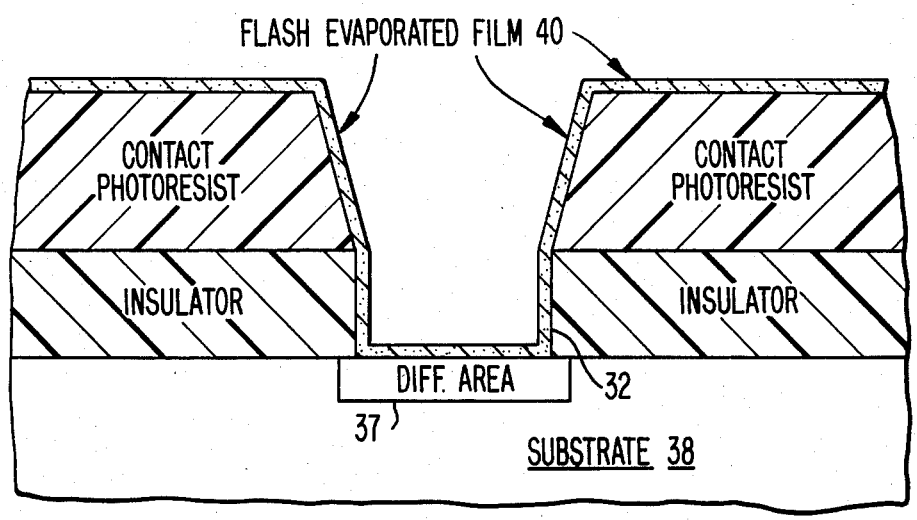
FIG. 6 illustrates the step of flash evaporating a thin protective layer over the etched contacts and insulator sidewalls.

Referring to FIG. 6, in accordance with the invention, a flash evaporation step is then performed. From 100-300 angstroms of a protective film 40, such as silicon, is flash evaporated onto the etched contact sidewalls 32. This step protects the sides 32 of the subsequently to be deposited contact metal from attack by alkaline resist developer or other chemical etchants and thereby protect it from corrosion.

Figure 7:
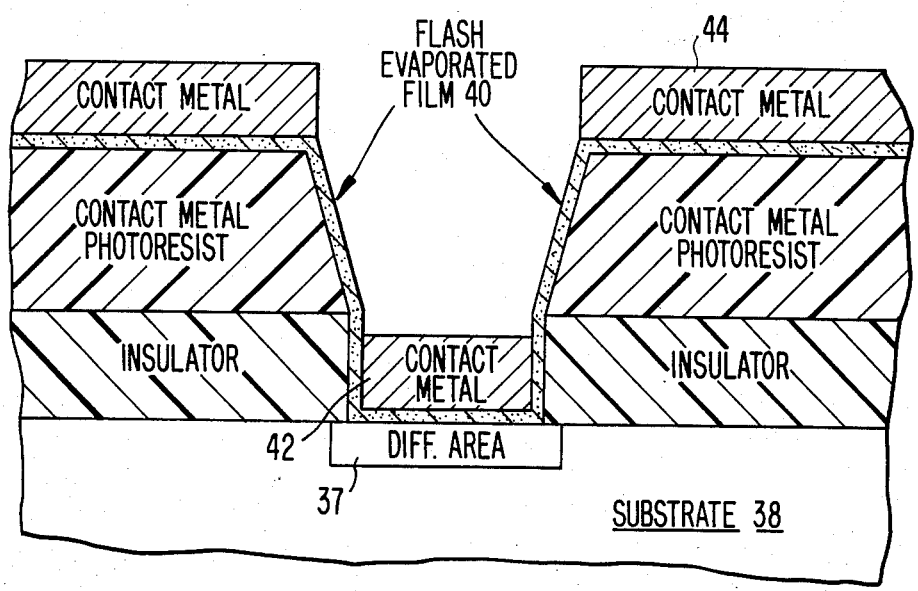
FIG. 7 illustrates the step of blanket depositing contact metal.
Figure 8:
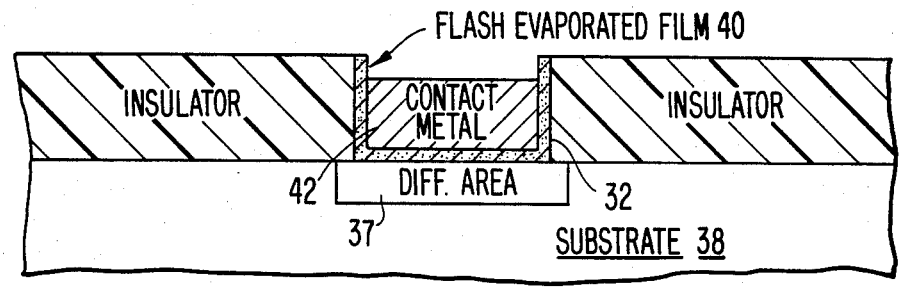
FIG. 8 illustrates the step of lifting off unwanted metal.

Thereafter, contact metal 42 is blanket deposited by either evaporation or sputtering onto all exposed surfaces, as is shown in FIG. 7. Referring to FIG. 8, unwanted contact metal 44 shown in FIG. 7 is lifted off and the desired remaining contact metal 42 is intact on the silicon substrate or ion implant diffused 37 in the etched region 32. Additional protection can be achieved by depositing an additional film over the interface between the metal contact and the via hole to completely sealed the device by filling in the gap or void.

Figure 9:
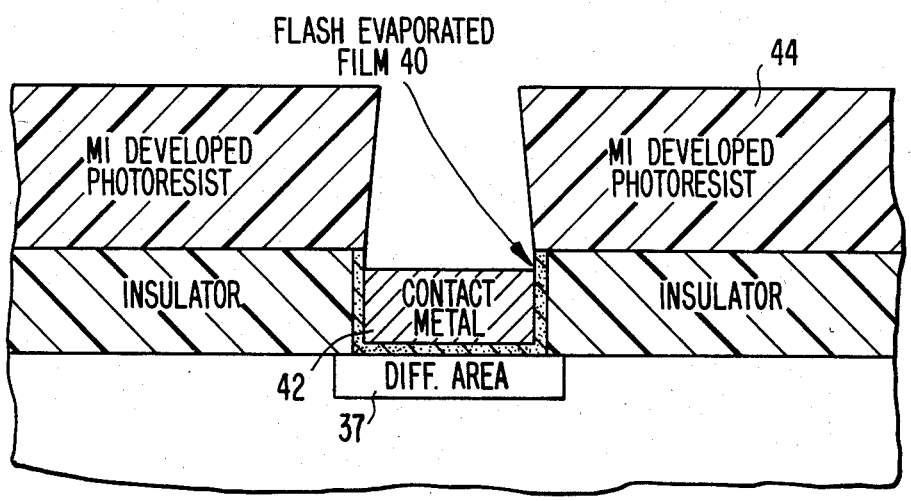
FIG. 9 illustrates the step of developing the photoresist structure for interconnect metal prior to metal deposition.

As shown in FIG. 9, interconnect metal photoresist layer 44 is applied, exposed and developed so as to expose the contact metal 42 which was previously deposited.

For carrying out the process steps for depositing interconnect metal, reference is made to U.S. Pat. Nos. 4,377,633; 4,076,575; 3,985,597; and 3,873,361 assigned to the same assignee as this application. Photolithography and metal deposition procedures can be applied to complete the device and are described in detail in these patents and their disclosures are hereby incorporated by reference.

Referring to FIG. 2, by preventing the subsequently applied developer from etching along the interface between the insulator layer 17 and the lateral sides of the metal contact 14, the cross-sectional dimensions of the contact can be preserved as shown shown in FIG. 8, thereby maintaining a low electrical contact resistance. This becomes especially important for submicron geometries where this phenomenon of photoresist developer attack of the metal structures produces significantly high contact resistance.

An advantage of our invention is that although contact metal is deposited at an angle to the device wafer surface, primarily because the molten metal source is not at a "line of sight" perpendicular to the wafer surface, no voids or spacing will exist between the contact metal and the sides of the etched insulator.

Although a specific embodiment of the invention has been disclosed, it will be understood by those skilled in the art that the foregoing and other changes in form and details may be made therein without departing from the spirit and the scope of the invention. For example, although silicon has been described as the preferred protective film 40, other materials such as titanium, germanium, nitride, molybdenum silicide, and tungsten silicide can also be used. It is this class of materials which is preferred because they are resistant to corrosion effects caused by chemicals, and can be deposited with state-of-the-art equipment. However, other protective materials are not precluded from this invention.

Also, although the semiconductor material 38 is disclosed herein as preferably silicon, other substrate materials such as galium arsenide and indium phosphide can also be used.

Further, although the preferred contact metal 42 used in this invention is aluminum, other metals such as molybdenum, tungsten, titanium, and combinations of these materials can be utilized.

The preferred photoresist 30 utilized with this invention is any positive photoresist. However, other photoresist such as optical materials, electron beam or negative photoresist, wet or dry developable, can also be used.

We claim:

1. In a metal lift-off process for the deposition of a metal structure on a substrate, a method for protecting the sides of the metal structure from attack by chemicals used in subsequent processing steps, comprising the steps of:

providing a substrate with an overlying insulating layer;

applying a layer of photoresist on the insulating layer;

forming a window with sidewalls through the photoresist and insulating layers down to the substrate surface;

flash evaporating a layer of protective semiconductor material which is resistant to attack by the chemicals used for photoresist removal on all surfaces of said sidewalls of said window;

depositing contact metal in said window and in contact with the substrate surface and with the sides of the metal structure conforming to the surface of said protective layer covering the sidewalls of said window; and applying etching chemicals for photoresist removal and lift-off of undesired metal.

2. The process as claimed in claim 1 wherein said protective semiconductor material is silicon.

3. The process as claimed in claim 1 wherein said protective semiconductor material is germanium.

4. The process as claimed in claim 1 wherein the thickness of the layer of protective semiconductor material is in the range 100–300 angstroms.

5. The process as claimed in claim 1 wherein said protective semiconductor material is gallium arsenide.

6. The process as claimed in claim 1 wherein said protective semiconductor material is indium phosphide.

7. The method of claim 1, wherein said substrate is selected from the group consisting of silicon and gallium arsenide; said metal is selected from the group consisting of aluminum, molybdenum, tungsten and titanium; and said photoresist is selected from the group consisting of optical photoresist, electron beam photoresist, positive photoresist and negative photoresist, wet or dry developable.

* * * * *